(12) United States Patent
Snyder

(10) Patent No.: US 6,214,632 B1
(45) Date of Patent: *Apr. 10, 2001

(54) ELECTRO-OPTICAL DEVICE WITH INTEGRAL OPTICAL ELEMENT

(75) Inventor: James J. Snyder, Soquel, CA (US)

(73) Assignee: Blue Sky Research, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/133,283

(22) Filed: Aug. 12, 1998

Related U.S. Application Data

(63) Continuation of application No. 08/725,151, filed on Oct. 1, 1996, now Pat. No. 5,888,841.

(51) Int. Cl.$^7$ .................................................. H01L 21/00
(52) U.S. Cl. ........................... 438/27; 438/27; 438/29; 438/31; 257/29; 257/31
(58) Field of Search ............................... 438/29, 27, 33; 257/29, 31

(56) References Cited

U.S. PATENT DOCUMENTS

| | | | |
|---|---|---|---|
| 4,588,261 | 5/1986 | Erhardt | 350/167 |
| 5,155,631 | 10/1992 | Snyder et al. | 359/708 |
| 5,514,888 | 5/1996 | Sano et al. | 257/232 |
| 5,888,841 | 3/1999 | Synder | 438/33 |

*Primary Examiner*—Matthew Smith
*Assistant Examiner*—Granville D. Lee, Jr.
(74) *Attorney, Agent, or Firm*—Lariviere, Grubman & Payne, LLP

(57) ABSTRACT

Electro-optical device characterized by having been formed into an individual unit with an integral optical element, and method to form the device. An optical element, for instance a length of cylindrical microlens, is aligned with a diode strip having a plurality of diodes, for instance laser diodes, and attached to the lens. Subsequent to this attachment, the composite structure consisting of the diode strip having attached to it the lens is sectioned into individual diodes, each of which has a integral lens attached thereto.

35 Claims, 15 Drawing Sheets

ELECTRO-OPTICAL DEVICE WITH INTEGRAL OPTICAL ELEMENT

CROSS-REFERENCE TO RELATED APPLICATIONS

This application is a continuation of application Ser. No. 08/725,151 filed Oct. 1, 1996 now U.S. Pat. No. 5,888,841.

TECHNICAL FIELD

The present invention relates to a methodology for integrally mounting optical elements to electronic components, and to electronic components so formed with integral optical components. More specifically, the present invention teaches a methodology particularly suited for the mounting of microoptical lenses to laser diodes during the process of manufacturing the diodes, resulting in increased accuracy of lens placement, which methodology requires fewer manufacturing steps to implement than prior mounting methods. The methodology taught herein is particularly well suited for mounting cylindrical microlenses to laser diodes, during the process of manufacturing the diodes, which results in a virtual point source laser diode.

BACKGROUND OF THE INVENTION

U.S. Pat. No. 5,081,639 teaches a laser diode assembly including a cylindrical lens. The laser diode assembly taught therein includes a diffraction-limited cylindrical lens having a numerical aperture greater than 0.5 which is used to collimate a beam from a laser diode. A collimated beam is one which is neither converging nor diverging; i.e., the rays within the beam are travelling substantially parallel to one another. Laser diodes are efficient sources of laser radiation, however the highly divergent beam emitted from a laser diode presents problems in many applications. The divergence of the laser diode's beam is caused by its exit aperture which is very narrow along one axis (the "fast" axis), and much wider along the other (perpendicular) axis. These two axes correspond to the X and Y axes, as will be later explained. The cross section of the beam emitted along the fast, or Y, axis is highly divergent due to diffraction effects. In comparison, the wider aperture, defined along the X axis, emits a beam cross section that diverges only slightly.

In order to collimate the beam produced by a laser diode, the invention taught in U.S. Pat. No. 5,081,639 teaches the mounting of a cylindrical lens optically aligned with the laser diode to provide a beam of collimated light from Y axis of the diode.

U.S. Pat. No. 5,181,224 illustrates the use of cylindrical lenses to (inter alia) create a slowly diverging beam light. This lens may be said to be "circularizing" and, when installed on any of a variety of laser diodes is available as the "CircuLaser" diode available from Blue Sky Research in Santa Cruz, Calif.

While the above-described laser diode assemblies are fully effective for their intended use, the method of manufacture has heretofore resulted in manufacturing inefficiencies. In any optical system, the alignment of the various optical elements is critical to the functioning of the system. This is certainly the case where a cylindrical microlens is incorporated into an optical system with a laser diode to provide a low-cost source of collimated light. As is typical of many optical applications, there are six degrees of freedom inherent in the positioning of the lens with respect to the laser diode, as shown in FIG. 1. Having reference to that figure, an optical element in the form of a cylindrical microlens 100 is schematically shown. The lens has three axes, X, Y and Z. The Z axis, 1, corresponds to the optical axis of the optical system. The X, 3, axis is transverse to the Z axis, 1, in the horizontal plane. The Y, 2, axis is also perpendicular to the Z axis but in the vertical direction. Positioning the lens along the X, Y, and Z axes defines the first three degrees of freedom. Furthermore, the lens may be rotated about each of these axes as shown at 10, 20, and 30, and each of these rotations also defines a degree of freedom with regard to alignment of the lens in the optical system. For cylindrical lenses, placement of the lens along the X axis, 3, is not critical. This fact means that the alignment of a cylindrical microlens with respect to a laser diode accurately requires alignment with five degrees of freedom.

It will be apparent to those of ordinary skill in the art that a mechanical translation stage providing the required five degrees of freedom is subject to considerable inaccuracies. These inaccuracies are the cumulative result of the tolerances required by any mechanical system for motion in essentially five directions.

To overcome this source of error, the manufacture of laser diode assemblies including microlenses has, to date, proceeded in a number of steps. First, a section of cylindrical microlens is mounted on a small mounting bracket which because of its resemblance to a football goal post is referred to as a "goal post." It is intended that rotation about the X and Y axes is defined by the lens' position on the goal post. After the lens is mounted on the goal post, the goal post/lens assembly is then optically positioned along the Z axis, and the lens affixed to the laser diode. In this manner, movement along the several axes, as well as rotation about those axes is manipulated by an operator who assembles each lens and laser diode. The entire operation is very dependent on the skill of the operator, as the optical cement utilized first to affix the lens to the goal post and finally to the diode introduces a variable into the problem. This variable is simply that the surface tension of the cement between the several elements on which it is used causes motion between those elements. This motion of course tends to misalign the optical elements.

From the foregoing discussion, it is apparent that the current manufacturing process for laser diode assemblies including a cylindrical microlens is a labor-intensive process, requiring considerable effort on the part of skilled technicians to effect the assembly of one lens to one diode.

What is needed is a methodology which will result in substantial savings in skilled manpower required to accurately assemble a cylindrical microlens or other optical element with a laser diode.

Laser diodes, or more properly, semiconductor lasers, are generally constructed according to well known principles of semiconductor manufacturing technology. A discussion of these principles can be found in Richard R. Shurtz II, *Semiconductor Lasers and LEDs* in *Electronics Engineers' Handbook,* 3rd ed. (Donald G. Fink and Donald Christiansen, eds. 1989). Semiconductor laser manufacturing technology comprises a number of broad steps as discussed in the cited reference. These manufacturing steps may be broadly summarized as crystal growth; wafer cutting and polishing; epitaxial growth; masking; passivation; diffusion; metalization, thick and/or thin film deposition; patterning and etching; the wafer sort process; cleaving and/or sawing the laser wafer into individual dice; and finally, assembly and testing of the dice. The process of cleaving and/or sawing the laser diode wafer into individual dice holds out the possibility for a partial solution to the previously discussed problem.

DISCLOSURE OF INVENTION

As opposed to the previously discussed process whereby individual microlenses are aligned and mounted to individual laser diodes, the principles of the present invention comprehend the alignment of a length of cylindrical lens with a plurality of laser diodes. In one embodiment of the present invention, this process is accomplished by cleaving or cutting the wafer, on which is formed the plurality of laser diodes, into at least one strip. This "diode-strip" has formed upon it a plurality of laser diodes, with the emitting faces of the diodes aligned along the long axis of the strip. See FIG. 2.

A carrier strip is provided on which to mount the laser diode strip, previously discussed. This carrier strip is generally broader in aspect that the previously discussed diode strip. In order to minimize differential thermal expansion between the diode strip and the carrier strip, it may be desirous that the carrier strip may be formed either of similar material as the diode strip, or selected from a material having a similar thermal coefficient of expansion. Many of the single crystal semiconductor materials from which semiconductors are formed possess a crystalline structure which cleaves in exceptionally straight lines. Where semiconductor material of this type is utilized in the manufacture of the laser diode, the present invention contemplates utilizing the straight cleavage lines so formed by this property to provide an alignment surface which will correspond with the X axis of the cylindrical lens, as previously discussed. It will be immediately appreciated by those of ordinary skill in the art that the several faces and surfaces of a cylindrical lens which are parallel to the X axis thereof are also exceptionally straight. Accordingly, these two very straight surfaces may be used as alignment surfaces which, when brought into physical parallelism result in substantial optical alignment along the X axis.

Where the previously discussed straight cleavage of the carrier and or diode is not feasible, the principles of the present invention comprehend the use of slitting saws, e.g.; diamond slitting saws, for separating the wafer into the previously discussed diode strips.

The diode strips are assembled to the carrier strips in any manner well-known to those of ordinary skill in the art. These techniques include, but are not necessarily limited to, soldering; the use of adhesives, polymeric or otherwise; eutectic bonding; thermocompression bonding; ultrasonic bonding; thermosonic bonding; and other attachment technologies well known to those of ordinary skill in the art.

After the attachment of the diode strip to the carrier strip, a length of cylindrical lens is aligned with the diode strip in the following manner: the cylindrical lens is positioned such that its X axis is parallel to the emitter faces of the several diodes in the diode strip. The lens is further aligned along its Y axis such that the Z axis of the lens coincides with the emitters of the diode strip. In order to effect the previously discussed alignment, the principles of the present invention specifically contemplate the use of spacers, either attached or removable, between one or all of the carrier strip, the diode strip, and the cylindrical lens.

Subsequent to alignment of the cylindrical lens with the diode strip, the lens is attached to the carrier strip in one of the previously discussed manners. Again, a spacer, formed of, for instance a similar material as the carrier strip, may be utilized to elevate one or both of the cylindrical lens and the diode strip into proper alignment one with the other.

At this point, there exists, according to the principles of the present invention, a carrier strip having integrally mounted thereto a diode strip and a cylindrical lens in substantial alignment with the diode strip. The integrally-assembled diode strip/lens/carrier may now be sectioned into individual laser diode dice, each die having a section integrally-mounted cylindrical microlens mounted in optical alignment with the emitter face of the diode. This sectioning may be effected by sawing, cleaving, or other well-known separation methods. Once the individual laser diode dice having integrally mounted cylindrical lenses are formed, they may be finally assembled into packages including electronic leads, in the manner well known to those of ordinary skill in the art. This process then utilizes a single alignment step which results in the production of a plurality of diodes having lenses integrally mounted thereto. Other features of the present are disclosed or apparent in the section entitled "BEST MODE OF CARRYING OUT THE INVENTION".

U.S. Pat. No. 5,081,639 teaches a laser diode assembly including a cylindrical lens.

U.S. Pat. No. 5,181,224 teaches several novel diffraction-limited microlens configurations which are especially valuable for use in conjunction with laser diodes.

U.S. Pat. Nos. 5,080,706 and 5,155,631 teach methods for fabricating cylindrical microlenses of selected shape, at least some of which microlenses may be suitable for use with laser diodes.

U.S. Pat. Nos. 5,080,706, 5,081,639, 5,155,631, and 5,181,224 are herewith incorporated by reference.

Other features of the present invention are disclosed or apparent in the section entitled "BEST MODE OF CARRYING OUT THE INVENTION".

BRIEF DESCRIPTION OF THE DRAWINGS

For fuller understanding of the present invention, reference is made to the accompanying drawing in the following detailed description of the Best Mode of Carrying Out the Invention. In the drawing.

Figure 1:
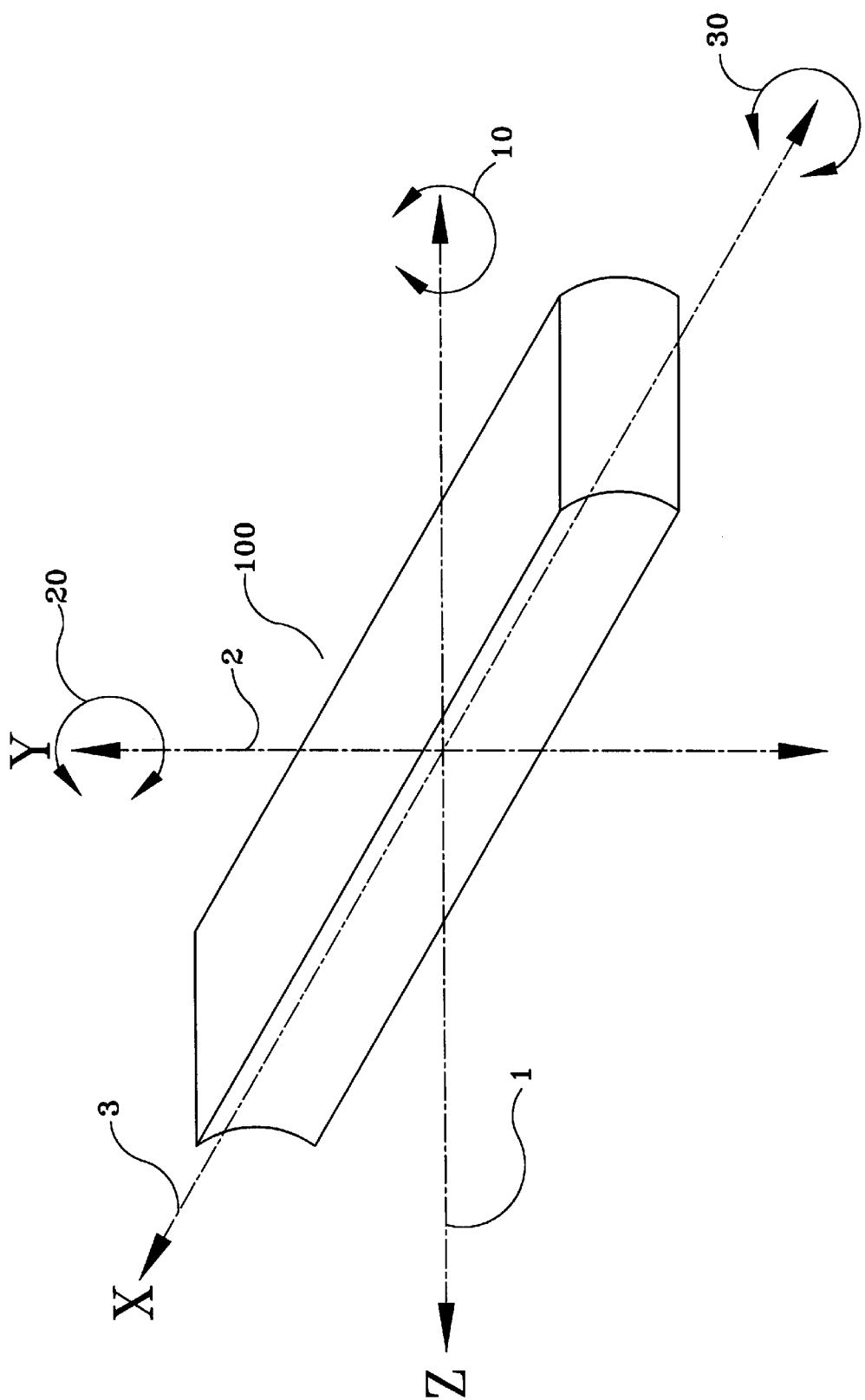
FIG. 1 is a depiction of the several axes defined by a cylindrical lens, and of the degrees of freedom inherent in these axes.

Reference numbers refer to the same or equivalent parts of the invention throughout the several figures of the drawing.

BEST MODE OF CARRYING OUT THE INVENTION

A length of cylindrical microlens, for instance a microlens constructed in accordance with the teachings of at least one of U.S. Pat. Nos. 5,080,706, 5,155,631, and 5,181,224, is fabricated. The length of the lens should be at least equal to the diameter of the crystal wafer from which the laser diodes will be formed.

Figure 2:
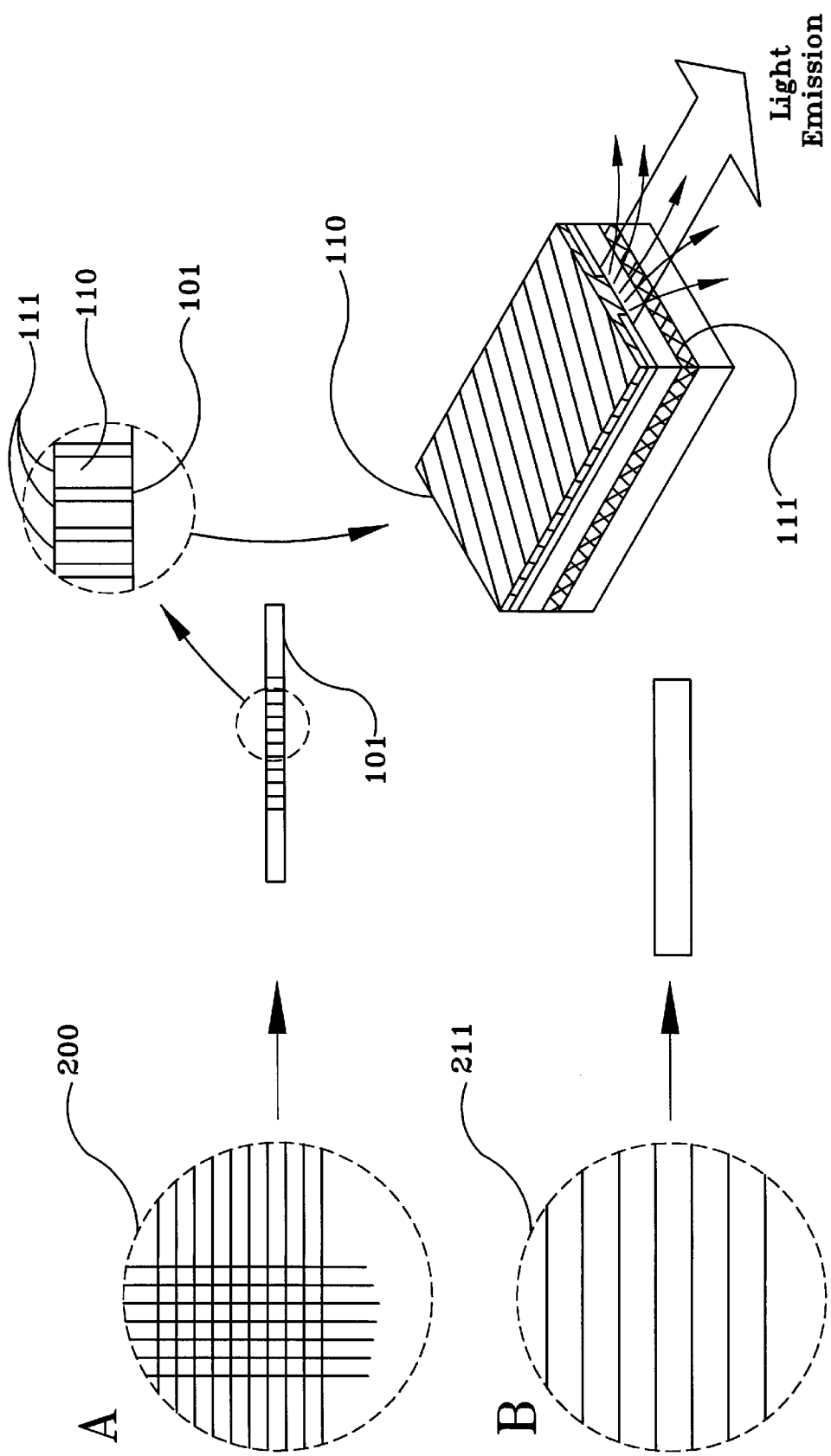
FIGS. 2A and 2B are representations of two semiconductor blank wafers.

Referring now to FIGS. 2A and 2B, laser diodes are formed in the conventional manner, for instance as discussed in E. A. Gerber et al., *Discrete Circuit Components;* Alan B. Grebene, et al., *Integrated Circuits and Microprocessors;* and Richard R. Shurtz II, *Semiconductor Lasers and LEDs;* all in *Electronics Engineers' Handbook,* 3rd ed. (Donald G. Fink and Donald Christiansen, eds. 1989), which is hereby incorporated by reference. Diodes 110 are formed on the surface of wafers 200. Laser diodes may be formed on gallium arsenide wafers, and the following discussion assumes the use of gallium arsenide as the substrate for diode production. It should be noted that while gallium arsenide is commonly employed to grow the crystal (not shown) from which wafers 200 are cut, the principles of the present invention specifically contemplate the use of alternate laser diode substrates, and indeed contemplate the utilization of the principles taught herein on other electronic devices, whether semiconductor or not.

Having continued reference to FIGS. 2A and 2B, after formation of diodes 110 on the wafer surface, wafer 200 is separated into diode strips 101. Diode strips may be referred to hereinafter as "a first unitary whole". In a first preferred embodiment of the present invention, this separation is effected by scoring and cleaving wafer 200 to form diode strips 101 as shown. Alternatively, the separation may be effected by slicing, shearing, cutting, sawing or other separation methodology well known to those of ordinary skill in the art. Diode strips 101 are cut from wafer 200 such that diodes 110 formed are aligned along the diode strip with the emitter faces 111 of a plurality of diodes 110 aligned along the long axis of strip 101. Furthermore, while the term "diode strip" is used extensively in describing a preferred embodiment of the present invention, the principles taught herein specifically contemplate the inclusion of additional electronic devices on the diode strips.

A carrier strip, 102, is next formed. In a preferred embodiment of the present invention, carrier strip 102 is formed from a wafer 211, in this case from a silicon crystal, but otherwise generally in the manner previously discussed. Again, while the term "carrier strip" is used extensively in describing a preferred embodiment of the present invention, the principles taught herein specifically contemplate the inclusion of additional electronic devices on the carrier strips. Further, some applications of the present invention may require the utilization of alternative carrier materials, including: alternative crystals, ceramics, metals, glasses, polymeric and monomeric isomers, and composite materials: the principles taught herein specifically contemplate the use of such alternative carriers. Finally, some implementations of the present invention may, by virtue of the geometry of the emitter itself (here the laser diode) not require a separate carrier itself. In these cases, the lens may be affixed directly to the emitter after alignment therewith.

It should be noted that carrier strips 102 may be cut from wafer 211 either before or after attachment of diode strip 101. In the preferred embodiment, carrier strip 102 is left attached to wafer 211 during attachment of diode strip 101 to facilitate alignment of lens 100. Further, internal stresses created during carrier formation may cause the carrier wafer 211 or carrier strip 102 to be other than perfectly flat. To preclude any alignment difficulties caused by this non-flat condition, carrier wafer 211 or carrier strip 102 is held flat to an optically flat surface, by means of clamps, jigs, fixtures or the like. In the preferred embodiment, a vacuum clamp is utilized.

Figure 3:
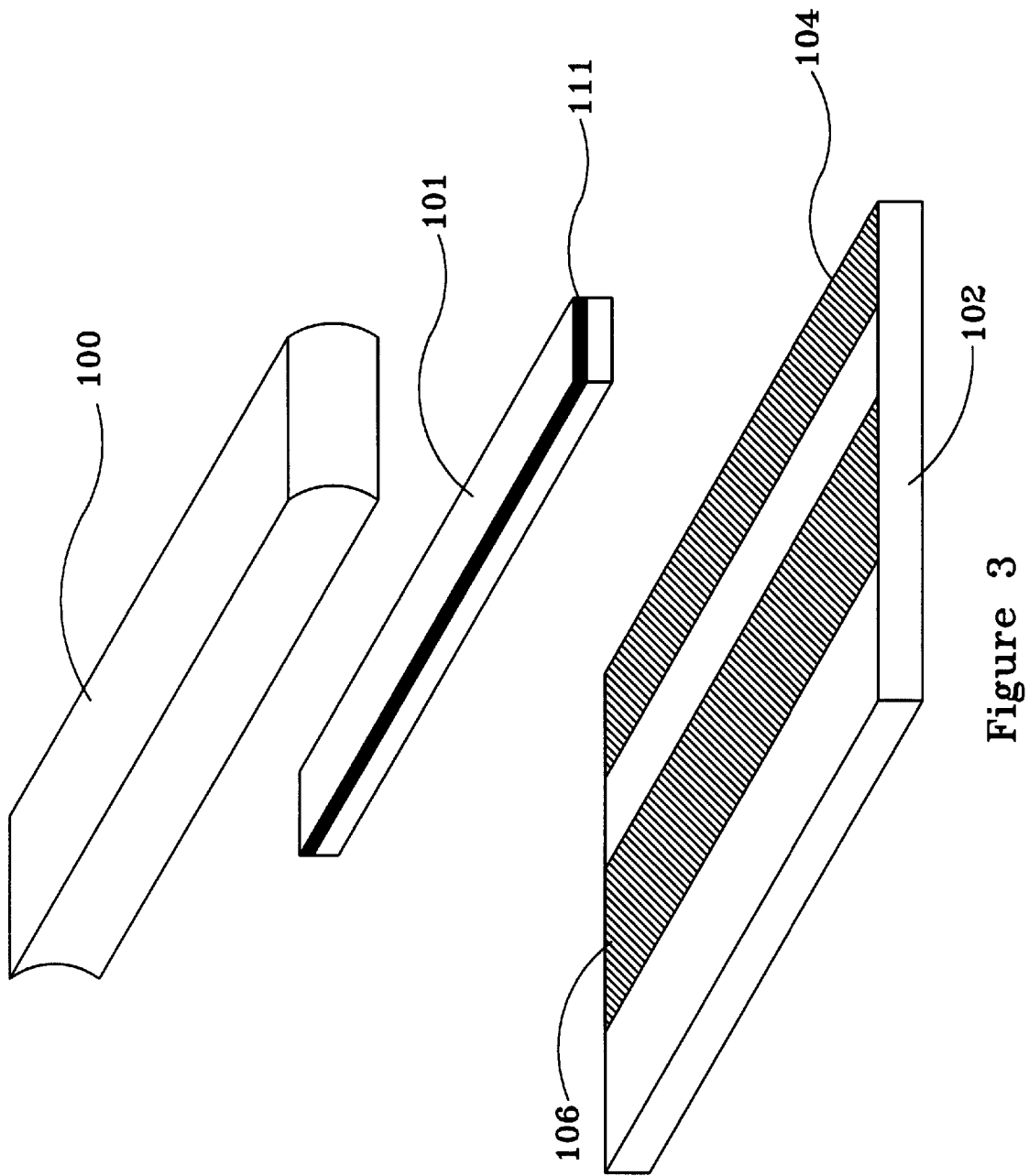
FIG. 3 is a perspective drawing of the assembly process for forming a plurality of laser diodes with integral cylindrical microlenses, wherein the lens thickness and the diode height have been matched to achieve alignment along the optical axis.

While the order of assembly is highly application dependent, in a preferred embodiment of the present invention, diode strip 101 is first assembled to carrier 102 by means of solder. Having reference to FIG. 3, this soldering is accomplished as follows: a film of metal is deposited by plating at least a portion (the underside not shown in this view) of diode strip 101, a further portion of lens 100 (again an under surface not shown in this view), and carrier 102 at 104 and 106. In this embodiment, a thin ($\leq 10 \mu$m) film of gold is utilized, but other metals and alternative thicknesses may, with equal facility, be employed. For each of the previously discussed plating steps, masks may be used to limit the plating of a given element to only those surfaces which are desirous of plating.

A thin coating, this time of indium solder, is deposited on the plated surfaces by means of vapor-phase deposition. Alternative deposition methodologies, for either or both of the aforementioned plating and solder deposition steps include, but are not necessarily limited to vacuum evaporation, cathode sputtering, anodization, and other metallic deposition methodologies well known to those of ordinary skill in the art.

After the application of solder to diode strip 101 and carrier strip 102, diode strip 101 is aligned with carrier strip 102 by aligning cloven edges 115 and 116, and the combined diode strip/carrier strip is then soldered together using oven-reflow soldering.

Figure 4:
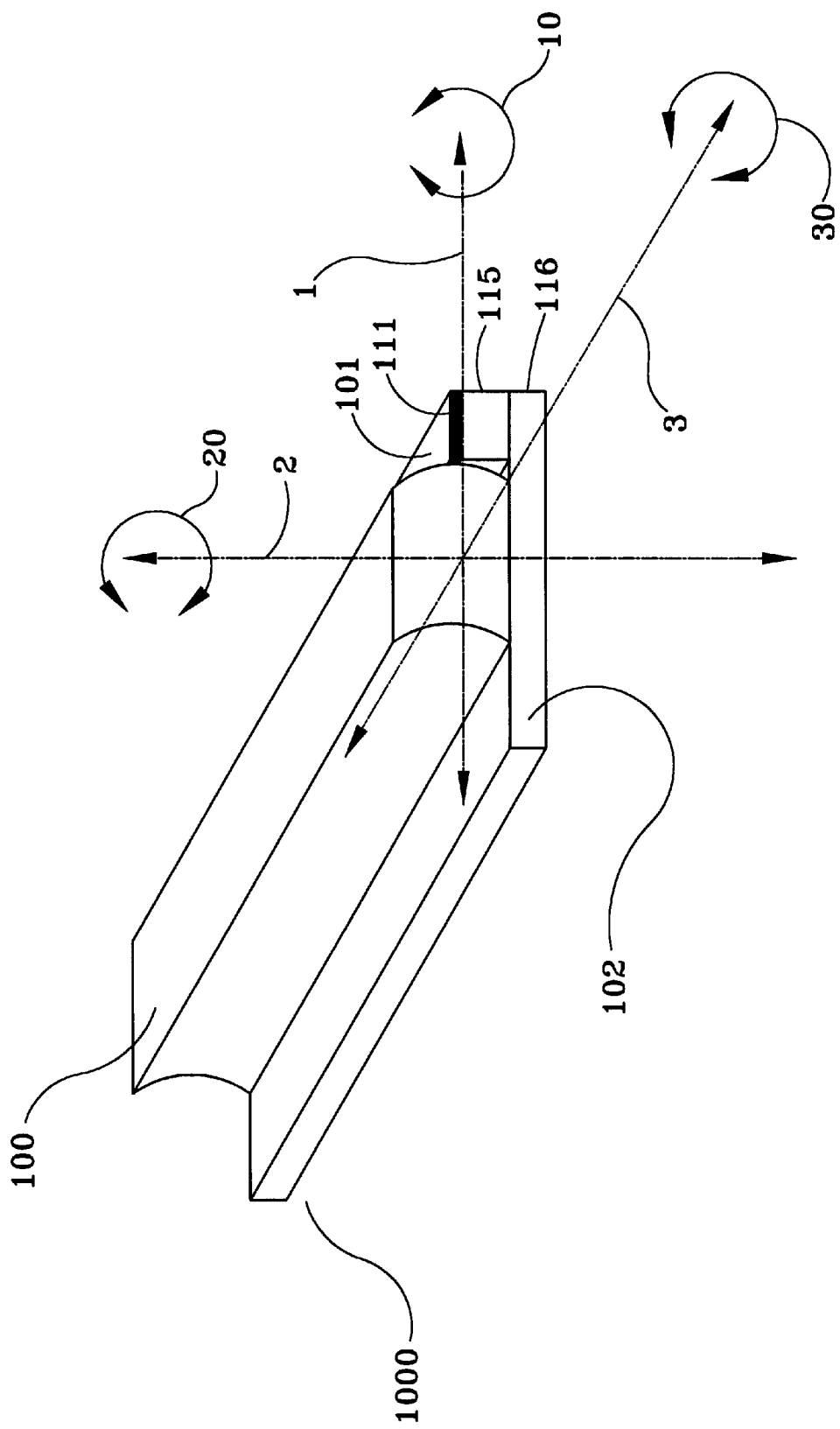
FIG. 4 is a perspective drawing of an assembled blank for forming a plurality of laser diodes with integral cylindrical microlenses formed by the assembly process illustrated in FIG. 3.

Referring now to FIG. 4, in accordance with a preferred embodiment of the present invention, after preparation of the diode strip/carrier assembly as previously discussed, lens 100 is aligned with the plurality of emitter faces 111 on diode strip 101, once again as previously discussed, and in general accordance with the laws of optical physics. Please note: the thickness of emitter faces 111 of the drawing herein has been exaggerated for purposes of illustrational clarity. Particular care is taken to align the Z axis 1 of lens 100 with emitter face 111 of diode strip 101: in this first preferred embodiment the height of lens 100 was chosen so that the Z axis of the lens coincides with the Z axis of the diode. Finally, lens 100 is aligned along Y axis 2 and rotationally about X, Y, and Z axes, 3, 2, and 1 respectively, at 30, 20, and 10. Alignment along X axis 3 is less critical as the nature of cylindrical lenses, in this exemplar, is more tolerant than the other five degrees of freedom. This alignment may be effected with one or more translation stages, jigs, fixtures or other methodologies well known to those of ordinary skill in the art.

Having continued reference to FIG. 4, after lens 100 is aligned with emitter faces 111, it is first optically tested at a minimum of one location, and preferably at several locations, along its length. This checking step may be performed as part of the normal wafer-sort process which most semiconductors undergo, or may be a separate step. After checking the alignment of lens 100 with diode strip 101, lens 100 is attached to carrier 102 in similar manner whereby diode strip 101 was attached thereto, thereby forming a diode rod having a length of integrally mounted cylindrical lens, that composite structure numbered 1000 herein.

Alternative solder heating methodologies well known to those of ordinary skill in the art may, with equal facility, be utilized for either of any of the soldering steps taught herein. These methodologies include, but are not necessarily limited to: hot gas soldering, wave soldering, vapor phase reflow soldering, laser reflow soldering, hot-bar soldering, hot gas soldering, and ultrasonic soldering.

Alternatives to the previously discussed plating step, for depositing a metallic coating on the various elements are: vacuum evaporation, cathode sputtering, vapor-phase deposition, anodization, and other metallic deposition methodologies well known to those of ordinary skill in the art.

Further, the previously discussed soldering methodology may, with equal facility, be replaced in some alternative embodiments by: eutectic bonding, chemical adhesives including polymeric and monomeric isomers, thermocompression bonding, ultrasonic bonding, thermosonic bonding, spot welding, or other attachment methodologies well known to those of ordinary skill in the art.

While the preferred embodiment contemplates soldering diode strip 101 and lens 100 to carrier 102 in two discreet steps, in some applications it may prove advantageous to align diode strip 101 with lens 100 in operative combination with carrier 102, and then to perform one soldering step wherein the several elements are soldered simultaneously. This alternative embodiment is also contemplated by the teachings of the present invention.

Figure 5:
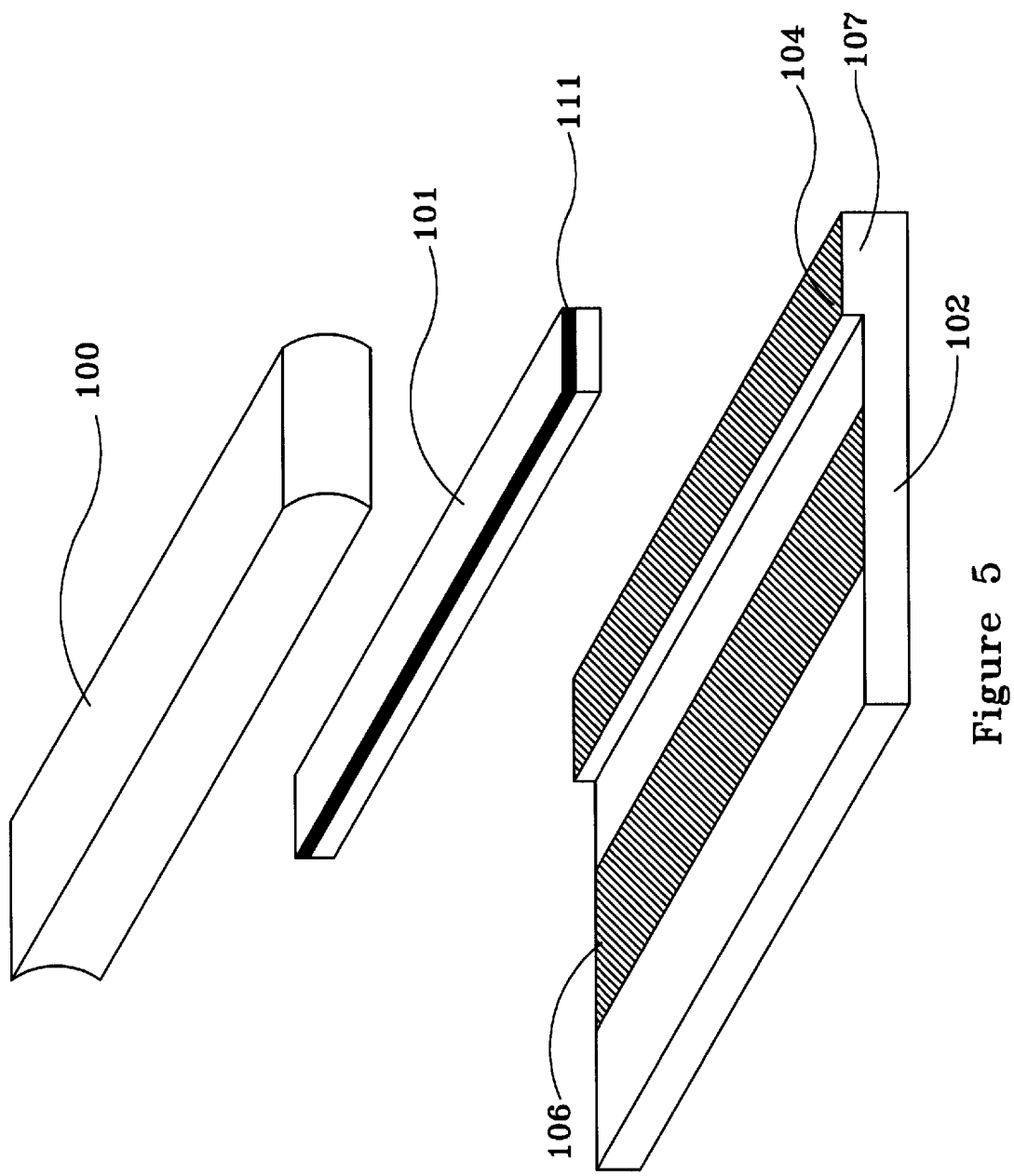
FIG. 5 is a drawing of the assembly process for forming a plurality of laser diodes with integral cylindrical microlenses, wherein the carrier has been etched to achieve alignment between the lens and the diode along the optical axis.
Figure 6:
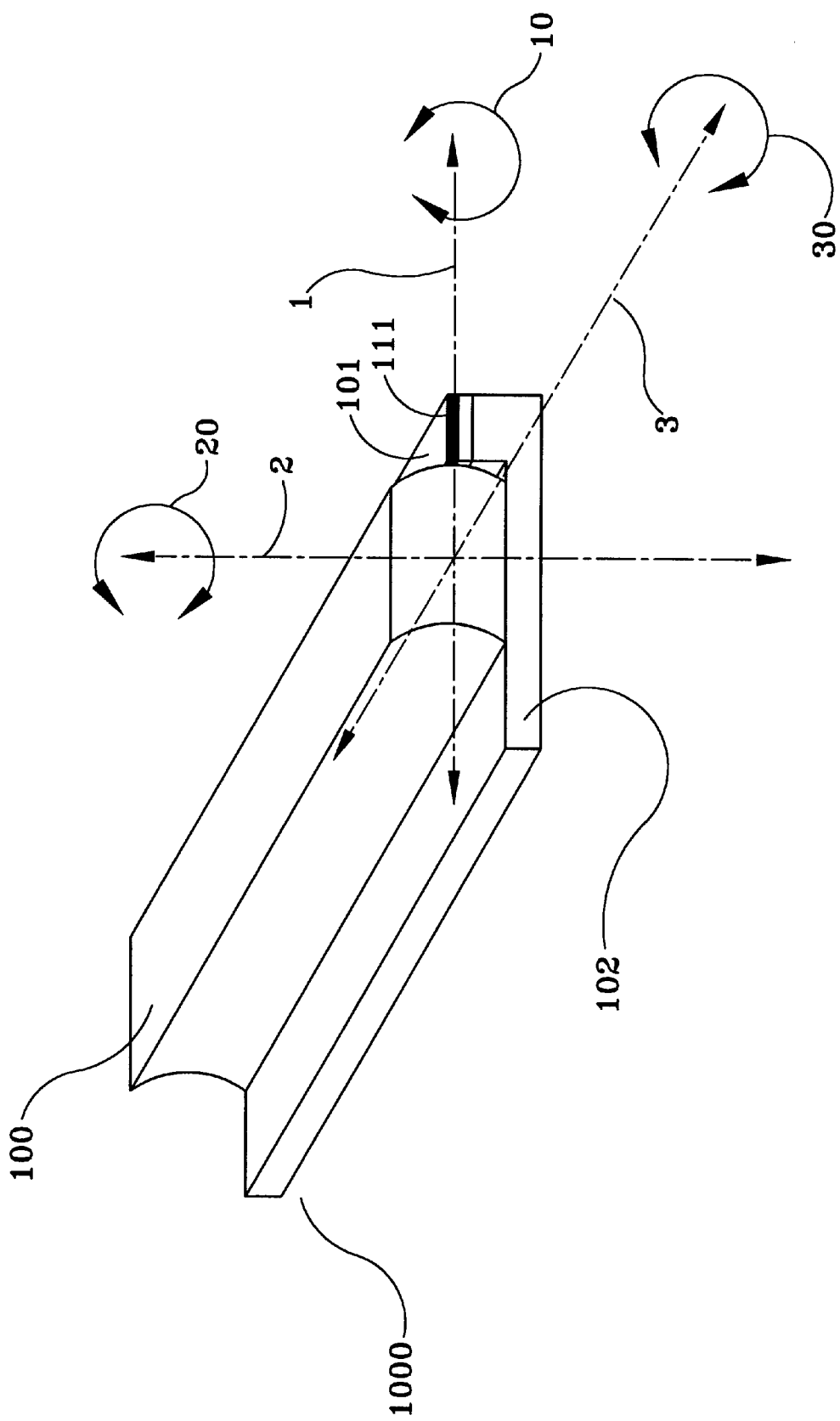
FIG. 6 is a perspective drawing of an assembled blank for forming a plurality of laser diodes with integral cylindrical microlenses formed by the assembly process illustrated in FIG. 5.

A second preferred embodiment of the present invention is shown in FIGS. 5 and 6. Referring to FIG. 5, this embodiment may be selected when the thickness of at least one of diode strip 101 and lens 100 is such that alignment of the two elements requires some adjustment along the Y axis (not shown). To practice this embodiment, carrier 102 is formed to create a step or elevated base 107, which step brings diode strip 101 into optical alignment along the Y axis with lens 100. The other elements are then assembled in the manner previously discussed, resulting in the apparatus shown in FIG. 6. Step 107 is preferably formed by etching carrier 102. Alternatively, step 107 may be formed by casting, milling, machining, extruding, or other material shaping methodologies well known to those of ordinary skill in the art. This embodiment may, with equal facility, be utilized to provide a step for lens 100 when its height, relative to diode strip 101 so requires.

Figure 7:
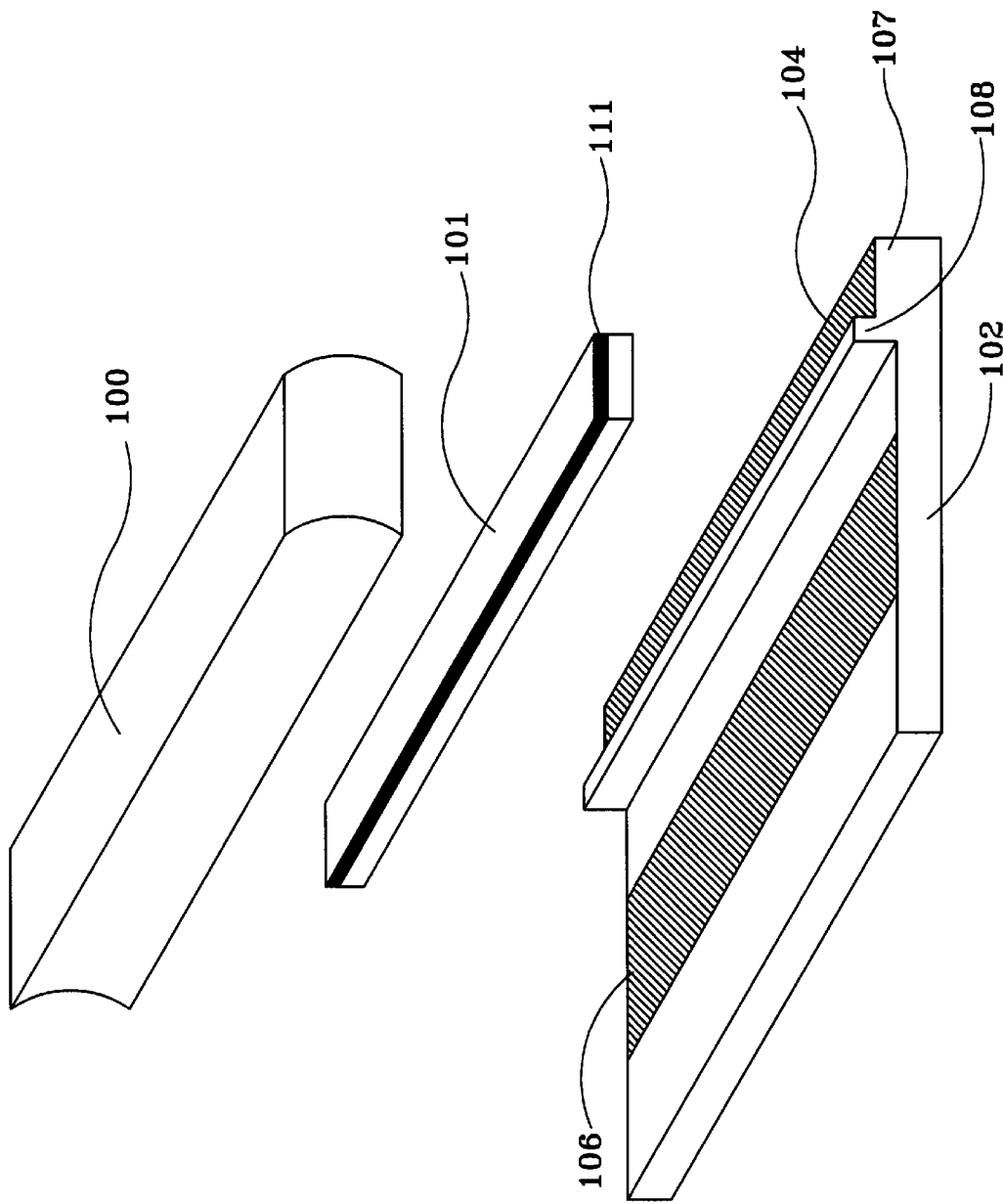
FIG. 7 is a drawing of the assembly process for forming a plurality of laser diodes with integral cylindrical microlenses, wherein the carrier has been etched to create a continuous step to achieve alignment between the lens and the diode along the optical axis, and to form a permanent spacer between the lens and the diode strip.
Figure 8:
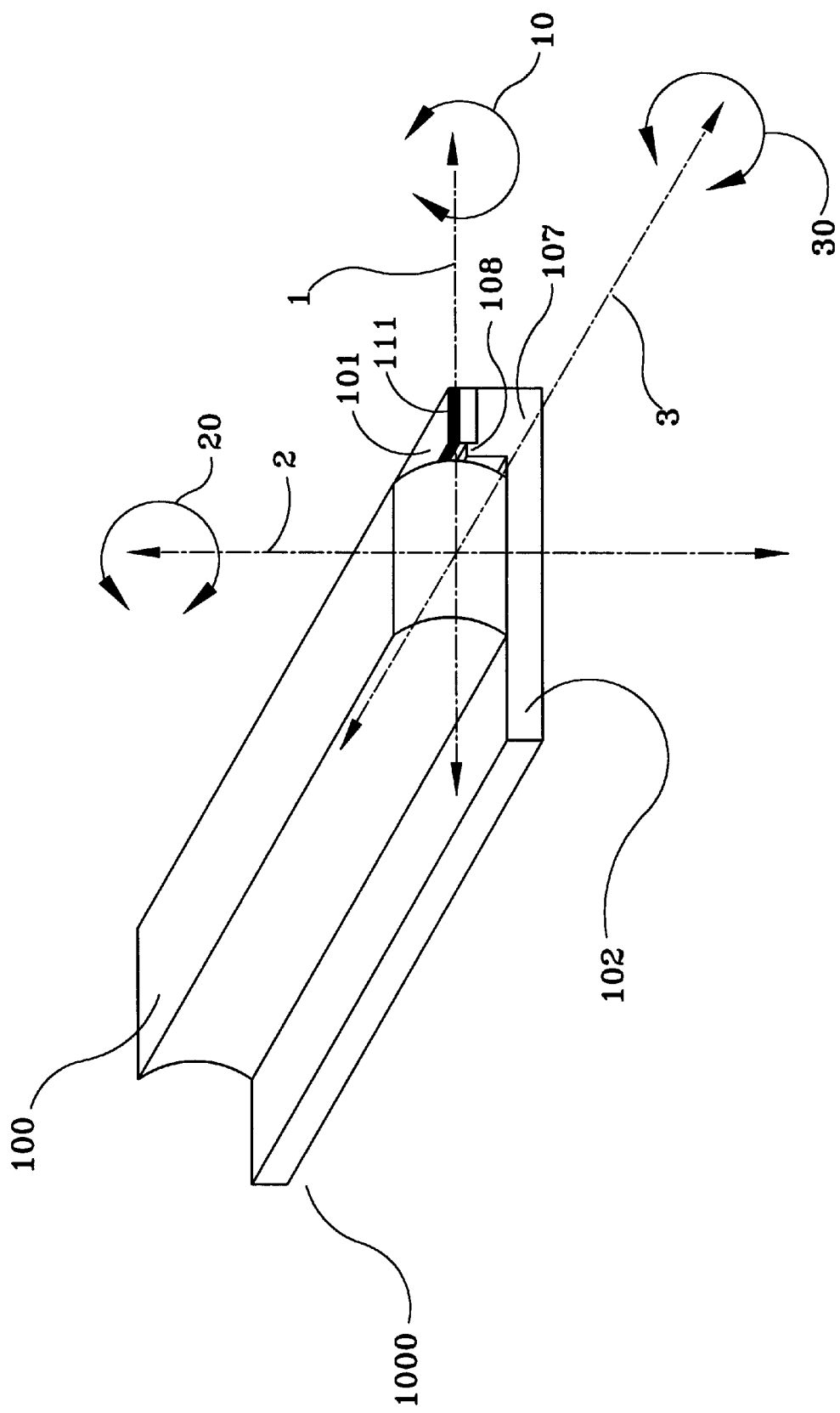
FIG. 8 is a perspective drawing of an assembled blank for forming a plurality of laser diodes with integral cylindrical microlenses formed by the assembly process illustrated in FIGS. 7 and 7A.

A third preferred embodiment utilizing an integral spacer to space and align lens 100 and diode strip 101 is shown in FIGS. 7 and 8. Referring now to FIG. 7, an additional step or vertical spacer 108 is formed on the surface of carrier 102 in such position that it serves as a spacer between lens 100 and diode strip, when those elements are assembled onto carrier 102. In this exemplar, spacer 108 is a continuous structure. Spacer 108 is formed to provide the requisite distance along the Z axis (not shown) to bring lens 100 and diode strip 102 into optical alignment along that axis. The height of spacer 108 is such that it does not intrude into the optical path between diode strip 101 and lens 100. Again, step 107 and spacer 108 are formed, in the preferred embodiment by etching, but the previously discussed alternative material forming methodologies may, with equal facility by utilized.

Further, it should be noted that spacer 108 is an extremely straight structure, the two vertical faces of which are substantially perfectly parallel. Accordingly, aligning the previously discussed reference surfaces of lens 100 and diode strip 101 with spacer 108 results in the accurate alignment of lens 100 with diode strip 101, thereby enabling the production of a plurality of diodes having integral lenses which production requires only a single alignment step.

The resulting apparatus is shown in FIG. 8. While this exemplar utilized both step 107 and spacer 108, it is contemplated by the principles of the present invention that spacer 108, whether integrally formed or not, may, with equal facility, be implemented in any of the embodiments disclosed herein.

Figure 7A:
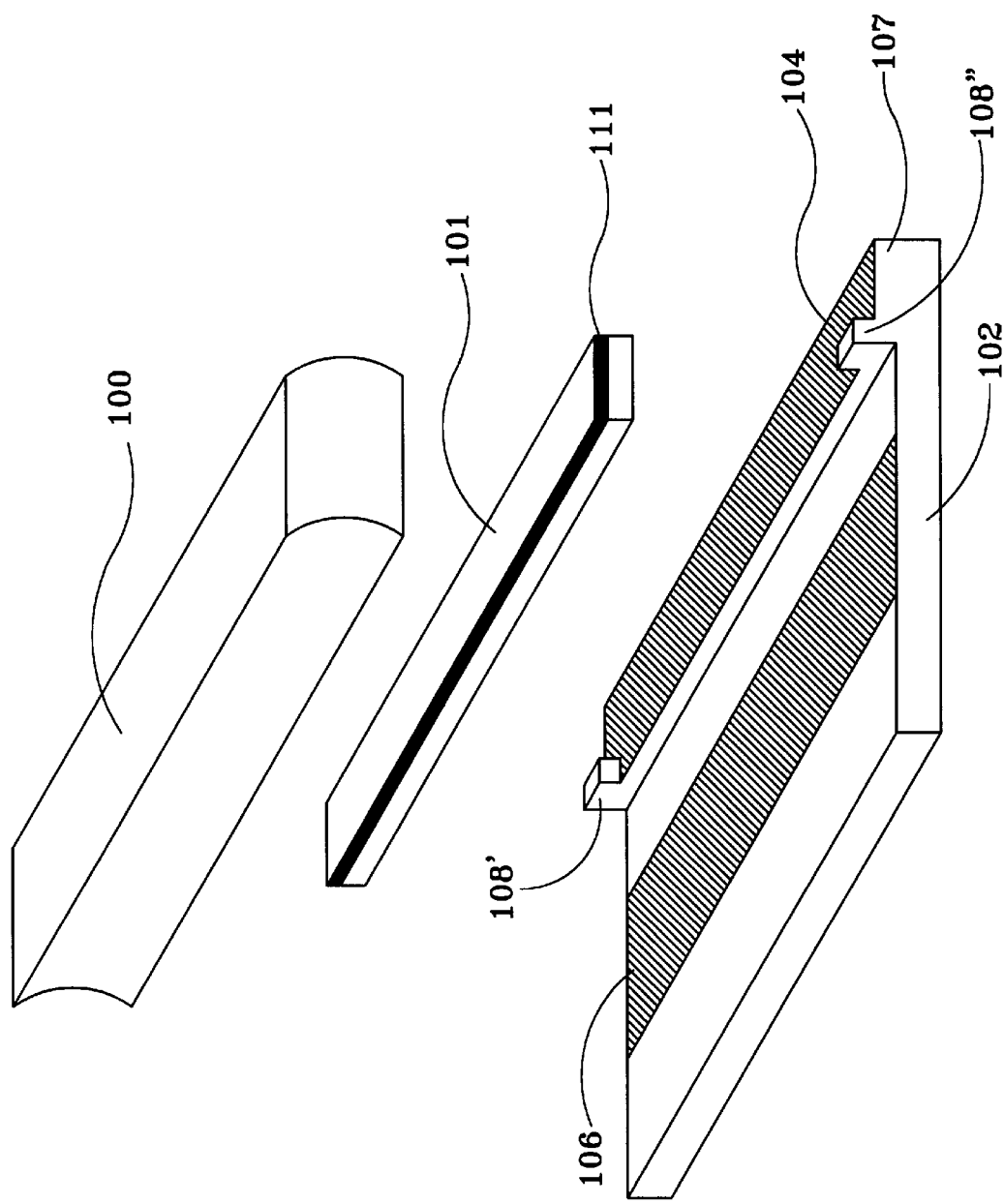
FIG. 7A is a drawing of the assembly process for forming a plurality of laser diodes with integral cylindrical microlenses, wherein the carrier has been etched to create a discontinuous step to achieve alignment between the lens and the diode along the optical axis, and to form a permanent spacer between the lens and the diode strip.

A further alternative to this embodiment is shown in FIG. 7A. According to this alternative, spacer 108 is discontinuous, and is formed, for instance, only at opposing ends of carrier 102 as spacer elements 108' and 108". The area between spacer elements 108' and 108" may be left substantially level with the surface to which diode strip 102 is mounted, which in this example is step 107. This same discontinuous spacer methodology may, with equal facility, be implemented by mounting pins, rods, solid structures and the like in place of spacers elements 108' and 108" on carrier 102. These alternative discontinuous spacers may alternatively be integrally formed or not, fixed or removable. Again, the resulting apparatus is shown in FIG. 8.

Figure 9:
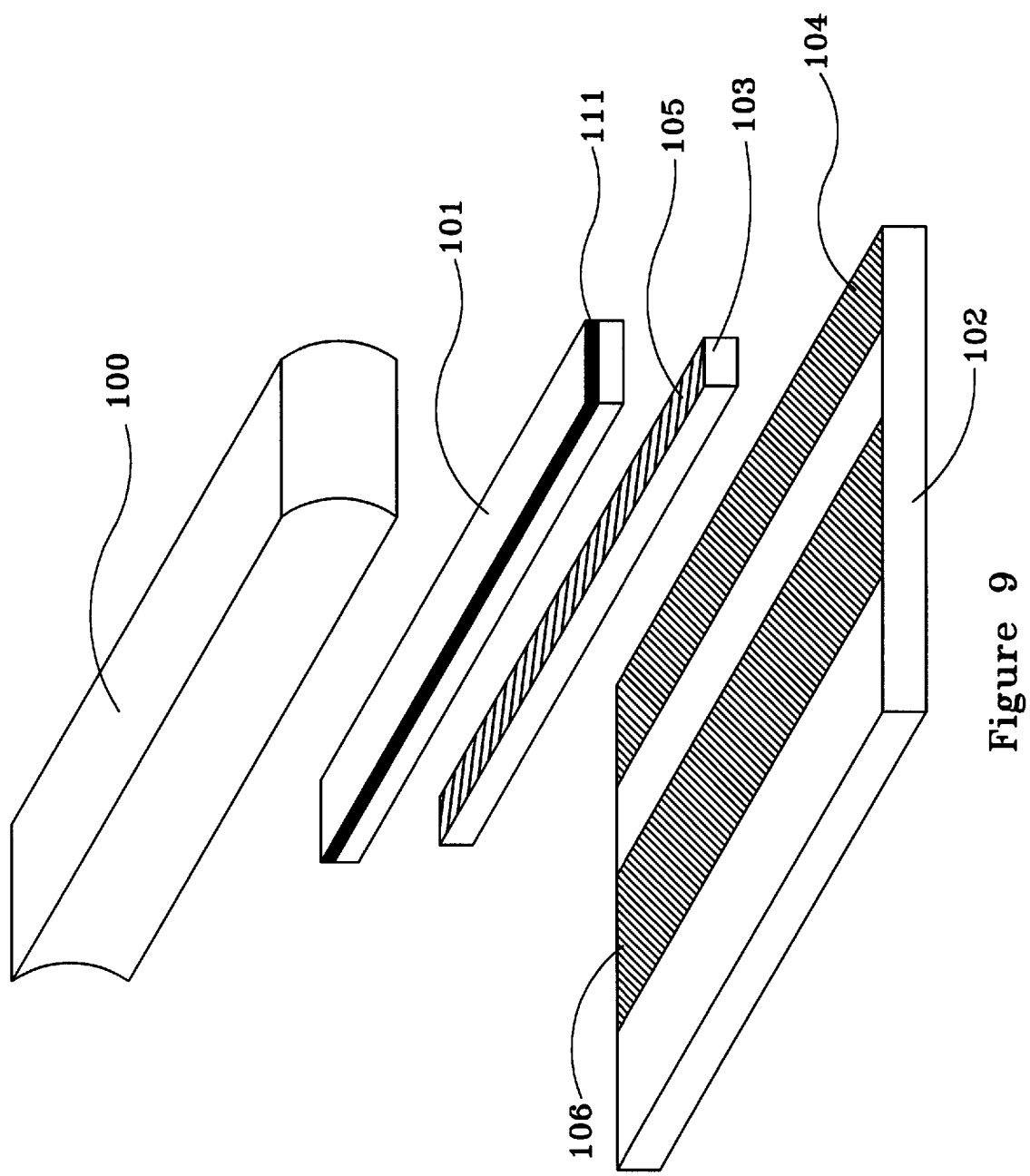
FIG. 9 is an drawing of the assembly process for forming a plurality of laser diodes with integral cylindrical microlenses, wherein a permanent spacer is inserted between the carrier and the diode to achieve alignment between the lens and the diode along the optical axis.
Figure 10:
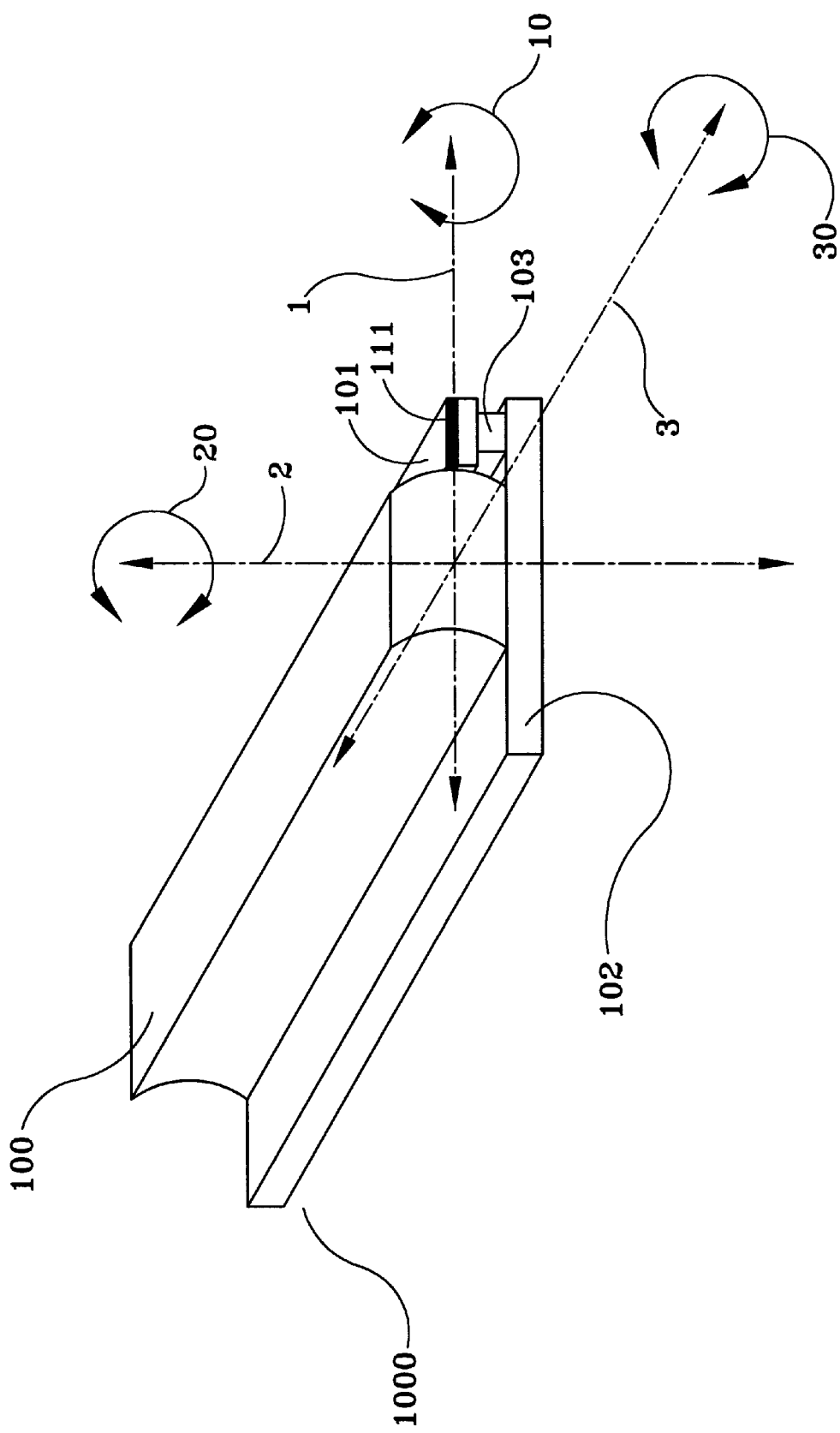
FIG. 10 is a perspective drawing of an assembled blank for forming a plurality of laser diodes with integral cylindrical microlenses formed by the assembly process illustrated in FIG. 9.

A fourth preferred embodiment is shown in FIGS. 9 and 10. Referring now to FIG. 9, the use of a built-up spacer 103 is shown. Spacer 103 is inserted between diode strip 101 and carrier 102. Spacer 103 is also formed, in this embodiment, of silicon wafer material, and is sized to bring emitter 111 of diode strip 101 into optical alignment with the optical, or Z axis (not shown) of lens 100. Spacer 103 is prepared for soldering in the same manner as diode strip 101 and carrier 102 by having at least two surfaces plated with solderable metal. In this view the upper plated surface is shown at 105, and the lower surface, which contacts carrier 102, is not shown. Spacer 103 is then soldered, or otherwise attached in the manner previously discussed. The resulting apparatus is shown in FIG. 10.

Figure 11:
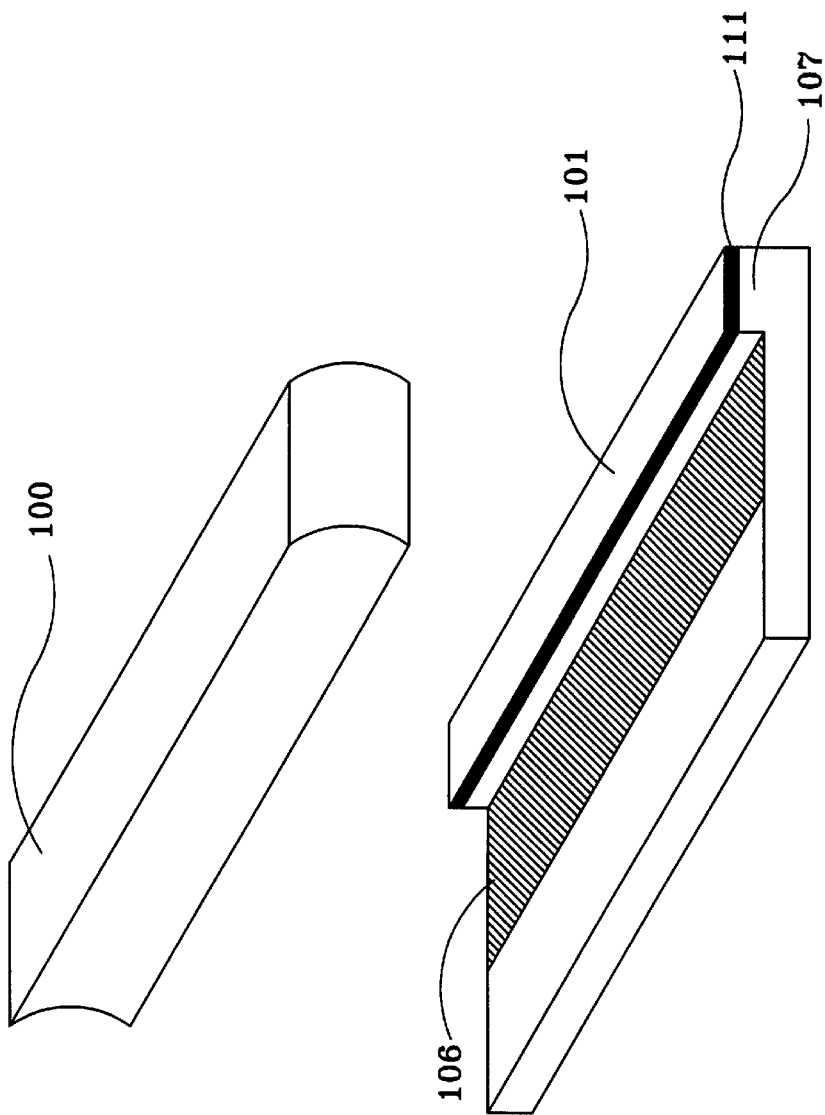
FIG. 11 is an drawing of the assembly process for forming a plurality of laser diodes with integral cylindrical microlenses, wherein the carrier is omitted, the diode strip taking its place and forming a permanent spacer for aligning the lens thereto.
Figure 12:
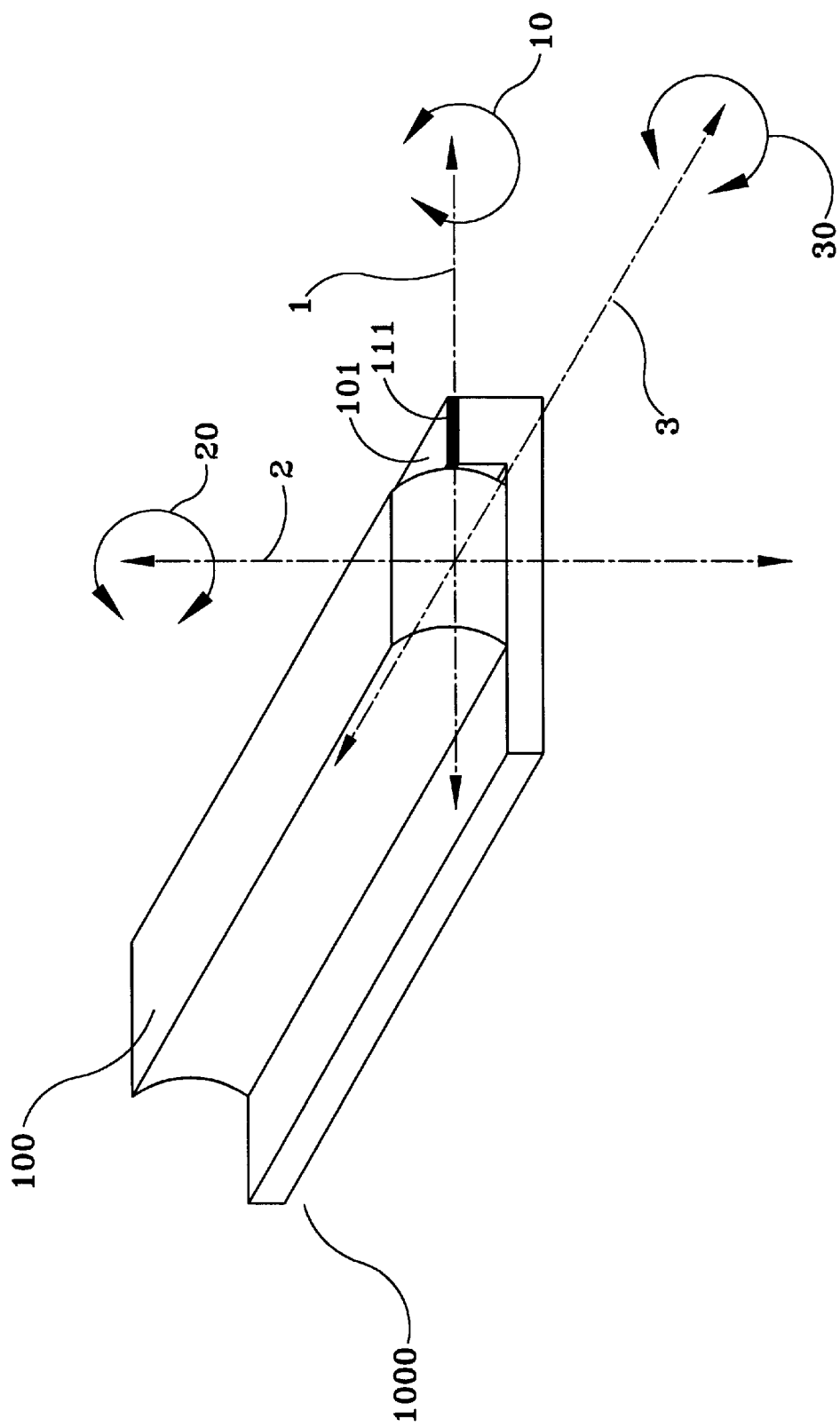
FIG. 12 is a perspective drawing of an assembled blank for forming a plurality of laser diodes with integral cylindrical microlenses formed by the assembly process illustrated in FIG. 11.

Finally, while the previous embodiments have all included a separate carrier 102 to which lens 100 and diode strip 101 are attached, the present invention teaches an embodiment whereby diode strip 101 itself forms the carrier upon which lens 100 is mounted. This embodiment is shown in FIGS. 11 and 12 and is carried out substantially identically to any of the previous embodiments, less the step whereby diode strip 101 is mounted to carrier 102. Having reference to FIG. 11, an exemplar of one of the previously discussed fabrication technologies applied to this embodiment is shown. In this exemplar, diode strip 101 is etched to create step 107, which step is accurately aligned with diode faces 111 and forms an alignment surface. Lens 100 is then aligned with step 107 and attached as previously discussed. This use of diode strip 101 as an integral carrier is accordingly specifically contemplated as a preferred embodiment of the present invention, and results in the device shown in FIG. 12.

Figure 13:
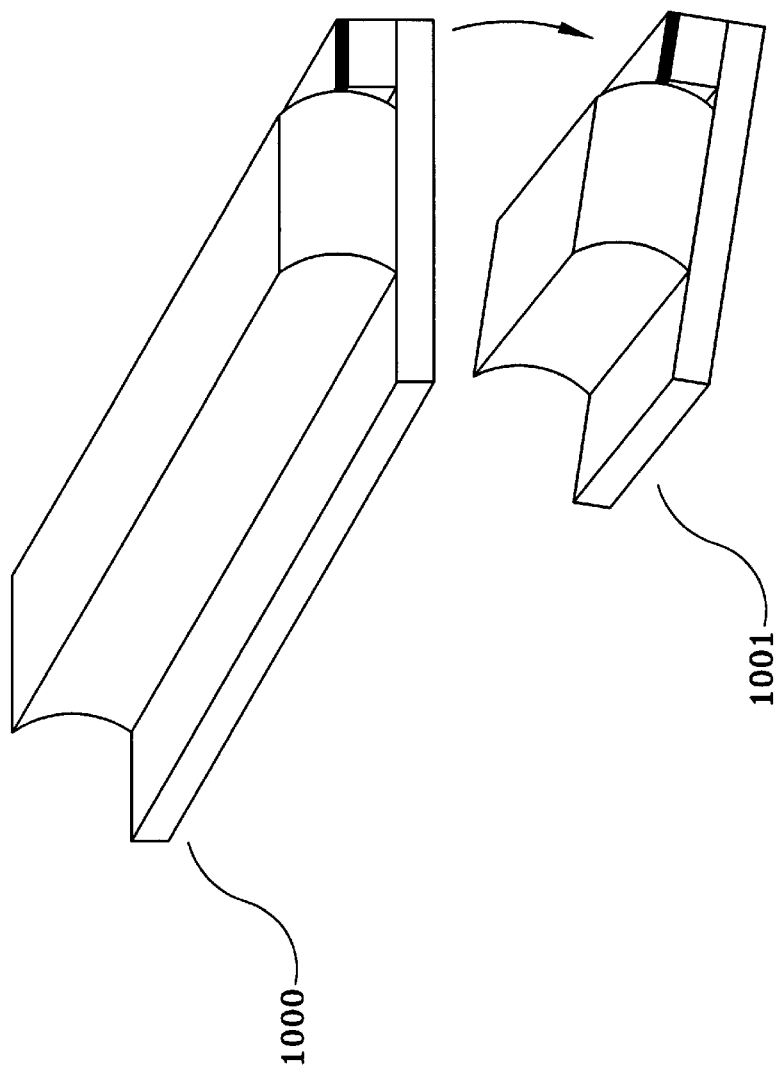
FIG. 13 is a perspective drawing of an assembled blank for forming a plurality of laser diodes with integral cylindrical microlenses, showing the separation of individual diode/lens dice.

Referring now to FIG. 13, following formation of diode rod, or second unitary whole 1000, it is sectioned into individual diode dice 1001, again in a manner well known to those of ordinary skill in the art including, but not limited to sawing, scoring, cleaving, cutting, and slicing. In a preferred embodiment of the present invention, diode rod 1000 is sectioned into dice 1001 by means of slitting with a diamond slitting saw. Dice 1001 may then be assembled into any desired components or packages in the ordinary manner.

It should be noted that while the foregoing discussions of the various preferred embodiments have discussed the use of cylindrical microlenses, it will be obvious to those having ordinary skill in the art that the principles enumerated herein are equally applicable to a much broader range of optical elements generally having cylindrical symmetry. By way of illustration but not limitation, optical elements include but are not necessarily limited to: lenses; prisms; etalons; diffraction gratings; optical fibers; fresnel lenses; mirrors; holograms; holographic diffraction gratings; beam splitters; polarizing optical elements; wave plates; graded index optical elements; attenuators; filters; apertures; and apodizers.

Figure 14:
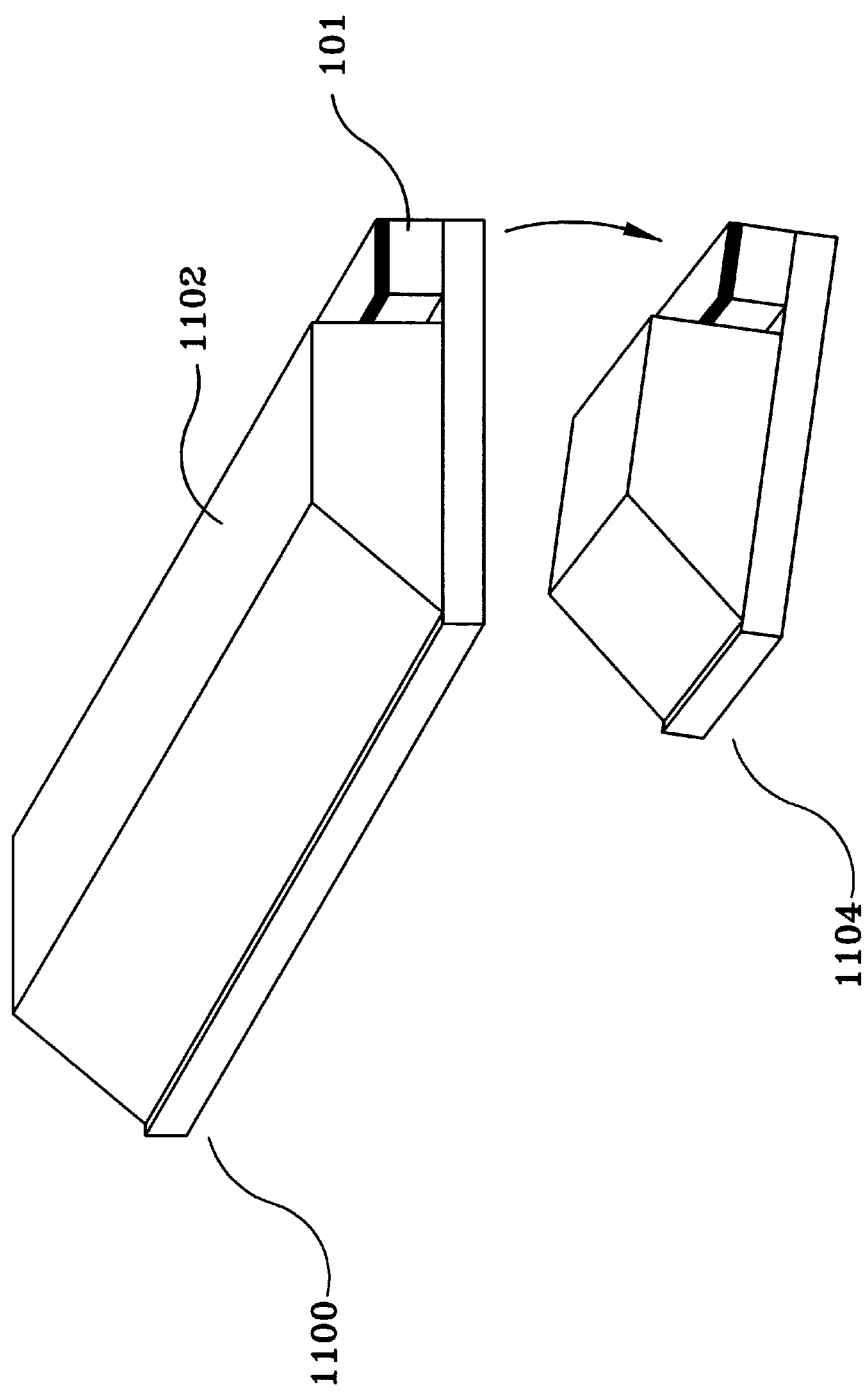
FIG. 14 is a perspective drawing of an assembled blank for forming a plurality of laser diodes with integral prisms, showing the separation of individual diode/prism dice.

One embodiment of the present invention, implementing the mounting of a prism to an electronic device is shown at FIG. 14. Having reference to that figure, an optical element schematically shown as cylindrical prism 1102 has been attached to a carrier 102, carrier 102 also having attached thereto a diode strip, 101, in the manner previously described, thereby forming second unitary whole, 1100. Second unitary whole 1100 is then sectioned, as previously described, into dice 1104. Other optical elements, as previously discussed, may be similarly employed where required.

The previous discussion has centered on a methodology for forming a laser diode formed with an integral cylindrical microlens. It will be immediately apparent to those of ordinary skill in the art that the principles of the present invention may, with equal facility, be applied to a broad range of electro-optical implementations. The principles of the present invention specifically contemplate those implementations.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the teachings of the present invention specifically contemplate the use of alterative: lens geometries; carrier geometries; diode geometries; carrier materials; diode materials; film deposition technologies; electronic or electro-optical devices; attachment methodologies; solder fluxes, alloys and soldering procedures; adhesives; and lens coating technologies. The invention disclosed herein may be practiced without any element which is not specifically disclosed herein.

What is claimed is:

1. A method for fabricating an electro-optical device including an optical element and an electronic device, the method comprising the steps of:

aligning said optical element with a plurality of electronic devices, said plurality of electronic devices forming a unitary whole;

attaching said optical element to said unitary whole;

sectioning said unitary whole and said optical element attached thereto into a plurality of individual electro-optical devices, each of said plurality of individual electro-optical devices including at least one of said plurality of electronic devices and an integral optical element.

2. The method of claim 1 comprising the further step of selecting said optical element from the group consisting of: lens; prism; etalon; diffraction grating; optical fiber; fresnel lens; mirror; hologram; holographic diffraction grating; beam splitter; polarizing optical element; wave plate; graded index optical element; attenuator; filters; aperture; and apodizer.

3. A method for forming an optical semiconductor device including a semiconductor and an optical element, the method comprising the steps of:

aligning said optical element with a plurality of semiconductors formed and aligned upon at least a portion of a wafer, said plurality of semiconductors forming a unitary whole;

attaching said optical element to said unitary whole;

sectioning said unitary whole and said optical element attached thereto into a plurality of individual optical semiconductor devices, each of said plurality of individual optical semiconductor devices including at least one of said plurality of semiconductors and an integral optical element.

4. The method of claim 3 comprising the further step of selecting said optical element from the group consisting of: lens; prism; etalon; diffraction grating; optical fiber; fresnel lens; mirror; hologram; holographic diffraction grating; beam splitter; polarizing optical element; wave plate; graded index optical element; attenuator; filters; aperture; and apodizer.

5. A method for forming an optical diode device including a diode and an optical element, the method comprising the steps of:

forming a first unitary whole of a plurality of diodes, the emitter face of each of said plurality of diodes being aligned along a first axis;

aligning said optical element with said first axis;

attaching said optical element to said first unitary whole, thereby forming a second unitary whole including said first unitary whole and said optical element; and sectioning said second unitary whole into a plurality of individual optical diode devices, each of said plurality of individual optical diode devices including at least one of said plurality of diodes and an integral optical element.

6. The method of claim 5 comprising the further step of forming said first unitary whole upon a crystalline wafer.

7. The method of claim 5 wherein said step of aligning further comprises the step of aligning said optical element with a second axis, said second axis being perpendicular to said first axis.

8. The method of claim 7 wherein said step of aligning further comprises the step of aligning said optical element with a third axis, said third axis being perpendicular to said first axis and said second axis.

9. The method of claim 5 wherein said step of attaching comprises the further step of soldering together said first unitary whole and said optical element.

10. The method of claim 9 wherein said step of soldering further comprises the step of depositing a first metallic coating on at least a portion of at least one of said first unitary whole and said optical element.

11. The method of claim 10 wherein said step of soldering further comprises the step of depositing a second metallic coating on at least a portion of at least one of said first unitary whole and said optical element.

12. The method of claim 11 wherein said step of soldering further comprises the step of soldering at least one of said first and said second metallic coatings utilizing oven reflow soldering.

13. The method of claim 11 comprising the further step of selecting, for at least one of said first metallic coating and said second metallic coating, a metallic deposition methodology from the group consisting of plating, vacuum evaporation, cathode sputtering, vapor-phase deposition, and anodization.

14. The method of claim 9 comprising the further step of selecting a soldering method from the group consisting of oven reflow soldering, hot gas soldering, wave soldering, vapor phase reflow soldering, laser reflow soldering, hot-bar soldering, hot gas soldering, and ultrasonic soldering.

15. The method of claim 5 comprising the further step of selecting an attachment methodology from the group consisting of soldering, eutectic bonding, chemical adhesion including the use of polymeric and monomeric isomers, thermocompression bonding, ultrasonic bonding, thermosonic bonding, and spot welding.

16. The method of claim 5 wherein said step of aligning further comprises the step of aligning a cleavage plane of said first unitary whole with a surface of said optical device.

17. The method of claim 16 wherein said step of aligning further comprises the use of at least one spacer to effect said alignment step.

18. The method of claim 17 comprising the further step of selecting at least one said spacer from the group consisting of attached spacer and removable spacer.

19. The method of claim 18 wherein said step of selecting at least one said spacer from the group consisting of attached spacer and removable spacer comprises the further step of forming said attached spacer on at least one of said first unitary whole and said optical element.

20. The method of claim 17 further comprising the step of selecting said spacer from the group consisting of continuous spacer and discontinuous spacer.

21. The method of claim 16 comprising the further steps of:

forming a carrier;

attaching said optical element to said carrier; and attaching said first unitary whole to said carrier, said first unitary whole and said optical element, thereby forming said second unitary whole.

22. The method of claim 21 wherein at least one of said step of attaching said optical element and said step of attaching said first unitary whole comprises the further step of soldering together said at least one of said carrier, said first unitary whole and said optical element.

23. The method of claim 22 wherein said soldering step further comprises the step of depositing a first metallic coating on at least a portion of at least one of said carrier, said first unitary whole, and said optical element.

24. The method of claim 23 wherein said soldering step further comprises the further step of depositing a second metallic coating on at least a portion of at least one of said carrier, said first unitary whole, and said optical element.

25. The method of claim 24 wherein said step of soldering further comprises the step of soldering at least one of said first and said second metallic coatings utilizing oven reflow soldering.

26. The method of claim 24 comprising the further step of selecting, for at least one of said first metallic coating and said second metallic coating, a metallic deposition methodology from the group consisting of plating, vacuum evaporation, cathode sputtering, vapor-phase deposition, and anodization.

27. The method of claim 22 comprising the further step of selecting a soldering method from the group consisting of oven reflow soldering, hot gas soldering, wave soldering, vapor phase reflow soldering, laser reflow soldering, hotbar soldering, hot gas soldering, and ultrasonic soldering.

28. The method of claim 21 comprising the further step of selecting an attachment methodology from the group consisting of soldering, eutectic bonding, chemical adhesion including the use of polymeric and monomeric isomers, thermocompression bonding, ultrasonic bonding, thermosonic bonding, and spot welding.

29. The method of claim 16 wherein said step of aligning further comprises the step of aligning a cleavage plane of said first unitary whole with a surface of said microlens.

30. The method of claim 29 wherein said step of aligning further comprises the use of at least one spacer to effect said alignment step.

31. The method of claim 30 comprising the further step of selecting at least one said spacer from the group consisting of attached spacer and removable spacer.

32. The method of claim 31 wherein said step of selecting at least one said spacer from the group consisting of attached spacer and removable spacer comprises the further step of forming said attached spacer on at least one of said first unitary whole and said microlens.

33. The method of claim 30 further comprising the step of selecting said spacer from the group consisting of continuous spacer and discontinuous spacer.

34. The method of claim 5 comprising the further step of selecting said optical element from the group consisting of: lens; prism; etalon; diffraction grating; optical fiber; fresnel lens; mirror; hologram; holographic diffraction grating; beam splitter; polarizing optical element; wave plate; graded index optical element; attenuator; filters; aperture; and apodizer.

35. A method for forming a laser diode device including a laser diode and a prism, the method comprising the steps of:

forming a diode strip on a crystalline wafer, said diode strip including a plurality of laser diodes, the emitter face of each of said plurality of laser diodes being aligned along a first axis;

aligning a first reference surface including a cleavage plane of said diode strip with said first axis, said step of aligning utilizing a discontinuous spacer etched into said diode strip for receiving therein said prism, said step of aligning further utilizing at least one surface of said prism as a second reference surface;

depositing, by vapor phase deposition, a first metallic coating on at least a portion of at least one of said diode strip and said prism;

oven-reflow soldering said diode strip and said prism into a unitary whole while maintaining the alignment between said diode strip and said prism; and sectioning said unitary whole into a plurality of individual laser diode devices, each of said plurality of individual laser diode devices including at least one of said plurality of laser diodes and an integral prism.

* * * * *